United States Patent
Shih et al.

(10) Patent No.: US 8,349,730 B2
(45) Date of Patent: Jan. 8, 2013

(54) TRANSITIONAL INTERFACE BETWEEN METAL AND DIELECTRIC IN INTERCONNECT STRUCTURES

(75) Inventors: Chien-Hsueh Shih, Taipei (TW); Shau-Lin Shue, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 223 days.

(21) Appl. No.: 12/823,649

(22) Filed: Jun. 25, 2010

(65) Prior Publication Data

US 2010/0267232 A1    Oct. 21, 2010

Related U.S. Application Data

(63) Continuation of application No. 11/786,241, filed on Apr. 11, 2007, now Pat. No. 7,777,344.

(51) Int. Cl.
*H01L 21/44* (2006.01)
*H01L 23/52* (2006.01)

(52) U.S. Cl. ........ 438/652; 438/643; 438/650; 438/653; 438/655; 257/751; 257/757; 257/768; 257/E23.157; 257/E23.161

(58) Field of Classification Search .......... 257/751–753, 257/757, 767, 768, E23.155, E23.157, E23.161; 438/626–628, 643–645, 648, 650, 653–656
See application file for complete search history.

(56) References Cited

U.S. PATENT DOCUMENTS

| | | | |
|---|---|---|---|
| 5,749,975 A | 5/1998 | Li et al. | |
| 5,980,977 A | 11/1999 | Deng et al. | |
| 6,022,669 A | 2/2000 | Uchida et al. | |
| 6,204,192 B1 | 3/2001 | Zhao et al. | |
| 6,207,553 B1 | 3/2001 | Buynoski et al. | |
| 6,218,303 B1 | 4/2001 | Lin | |
| 6,429,105 B1 | 8/2002 | Kunikiyo | |
| 6,475,902 B1 | 11/2002 | Hausmann et al. | |
| 6,495,453 B1 | 12/2002 | Brongersma et al. | |
| 6,528,409 B1 | 3/2003 | Lopatin et al. | |
| 6,613,697 B1 | 9/2003 | Faur et al. | |
| 6,656,832 B1 | 12/2003 | Pan et al. | |
| 6,713,377 B2 | 3/2004 | Lee et al. | |
| 6,730,616 B2 * | 5/2004 | Summerfelt | 438/775 |
| 6,743,473 B1 | 6/2004 | Parkhe et al. | |

(Continued)

FOREIGN PATENT DOCUMENTS

CN    1449015 A    10/2003

(Continued)

OTHER PUBLICATIONS

Translation for Ooka et al. (JP 2003-243392A). See the entire document.*

(Continued)

*Primary Examiner* — Matthew E Warren
(74) *Attorney, Agent, or Firm* — Slater & Matsil, L.L.P.

(57) ABSTRACT

An integrated circuit structure and methods for forming the same are provided. The integrated circuit structure includes a semiconductor substrate; a dielectric layer over the semiconductor substrate; an opening in the dielectric layer; a conductive line in the opening; a metal alloy layer overlying the conductive line; a first metal silicide layer overlying the metal alloy layer; and a second metal silicide layer different from the first metal silicide layer on the first metal silicide layer. The metal alloy layer and the first and the second metal silicide layers are substantially vertically aligned to the conductive line.

18 Claims, 4 Drawing Sheets

U.S. PATENT DOCUMENTS

| | | |
|---|---|---|
| 6,815,332 B2 | 11/2004 | San et al. |
| 6,844,258 B1 | 1/2005 | Fair et al. |
| 7,049,702 B2 | 5/2006 | Tseng |
| 2002/0036452 A1 | 3/2002 | Muroyama et al. |
| 2004/0087149 A1 | 5/2004 | Tessmer et al. |
| 2004/0126713 A1 | 7/2004 | Shiraishi et al. |
| 2004/0211357 A1 | 10/2004 | Gadgil et al. |
| 2004/0214424 A1 | 10/2004 | Chuang |
| 2005/0009325 A1 | 1/2005 | Chung et al. |
| 2005/0023698 A1 | 2/2005 | Lee |
| 2005/0029662 A1 | 2/2005 | Nakano et al. |
| 2005/0095830 A1 | 5/2005 | Weidman et al. |
| 2005/0194255 A1 | 9/2005 | Tiwari |
| 2006/0003570 A1 | 1/2006 | Shanmugasundram et al. |
| 2006/0138668 A1 | 6/2006 | Su et al. |
| 2006/0175708 A1 | 8/2006 | Ueno |
| 2007/0037389 A1 | 2/2007 | Chen et al. |
| 2007/0048991 A1 | 3/2007 | Shih et al. |
| 2007/0082473 A1 | 4/2007 | Shih et al. |
| 2008/0111239 A1 | 5/2008 | Yang et al. |
| 2008/0150137 A1 | 6/2008 | Liu et al. |

FOREIGN PATENT DOCUMENTS

| | | | |
|---|---|---|---|
| CN | 1536645 A | | 10/2004 |
| JP | 11016912 A | | 1/1999 |
| JP | 2002151518 A | | 5/2002 |
| JP | 2003243392 A | * | 8/2003 |
| JP | 2003243499 A | | 8/2003 |
| JP | 2005116630 | | 4/2005 |
| KR | 20010067081 A | | 7/2001 |

OTHER PUBLICATIONS

"Novel Cluster Tool Offers New Opportunities for Collaboration," Research Intelligence, http://www.liv.ac.uk/researchintelligence/issue1/cluster.html., Jun. 1999, 3 pages, Issue 1.

Chappell, J., "The Fab Line," Electronic News, http://www.reed-electronics.com/electronicnews/article/CA90465.html, Jun. 25, 2001, 4 pages.

Shacham-Diamand, Y., et al., "Electroless Deposition of Thin-Film Cobalt-Tungsten-Phosphorus Layers Using Tungsten Phosphoric Acid ($H_3[P(W_3O_{10})_4]$) for ULSI and MEMS Applications," Journal of the Electrochemical Society, 2001, pp. C162-C167, vol. 148, No. 3, The Electrochemical Society, Inc.

Chen, X., et al., "Advances in Remote Plasma Sources for Cleaning 300 mm and Flat Panel CVD Systems," Semi Conductor Magazine, reprinted Aug. 2003, 6 pages.

Kim, J. J., et al., "Oxidation Resistive Cu Films by Room Temperature Surface Passivation with Thin Ag Layer," Electrochemical and Solid-State Letters, 2003, pp. C17-C20, vol. 6, No. 2, The Electrochemical Society, Inc.

Lee, E., et al., "Evalution of PVD-deposited Cu Alloys for Interconnect Applications," Vertilog, Advances in Electronics Manufacturing Technology, Jul. 12, 2004, 4 pages, V-EMT.

"Pollution Prevention in the Plating Process," Metal Finishing Industry, http://www.p2pays.org/ref/03/02454/plating.htm, downloaded Sep. 27, 2005, 73 pages.

"Furnaces for Diffusion, Oxidation, Annealing, Low Pressure Chemical Vapor Deposition (LPCVD)," CVD Equipment Corporation, http://www.cvdequipment.com/furnaces.htm, downloaded Sep. 29, 2005, 3 pages.

"What are Electroplating and Vacuum Plating?," Shenzhen Goldenhouse Vacuum Technology Co., Ltd., http://china-goldenhouse.cn.news_detail.asp?id=133, downloaded Sep. 27, 2005, 1 page.

Moslehi, B., "Batch Wet Process Still Dominates Wafer-Cleaning Market," MICRO: Reality Check, http://www.micromagizine.com/archive/04/04/reality.html, downloaded Sep. 29, 2005, 4 pages.

Corresponding Korean 1020060091477, Translation of Office Action, Aug. 23, 2007, 4 pages.

Corresponding Japanese 2006270542, Translation of Notice of Rejection, Mar. 10, 2009, 5 pages.

* cited by examiner

TRANSITIONAL INTERFACE BETWEEN METAL AND DIELECTRIC IN INTERCONNECT STRUCTURES

This application is a continuation of U.S. patent application Ser. No. 11/786,241, filed Apr. 11, 2007, and entitled "Transitional Interface Between Metal and Dielectric in Interconnect Structures," which application is hereby incorporated herein by reference.

TECHNICAL FIELD

This invention is related generally to integrated circuits, and more particularly to the structure and formation methods of interconnect structures in integrated circuits, and even more particularly to the formation of interface layers between copper features and dielectric layers.

BACKGROUND

A conventional integrated circuit contains a plurality of patterns of metal lines separated by inter-wiring spacings, and a plurality of interconnect lines, such as bus lines, bit lines, word lines and logic interconnect lines. Typically, the metal patterns of vertically spaced metallization layers are electrically interconnected by vias. Metal lines formed in trench-like openings typically extend substantially parallel to the semiconductor substrate. Semiconductor devices of this type, according to current technology, may comprise eight or more levels of metallization to satisfy device geometry and micro miniaturization requirements.

A common method for forming metal lines is known as "damascene." Generally, this process involves forming an opening in the dielectric interlayer, which separates the vertically spaced metallization layers. The opening is typically formed using conventional lithographic and etching techniques. After an opening is formed, the opening is filled with copper or copper alloys to form a metal line and/or a via. Excess metal material on the surface of the dielectric interlayer is then removed by chemical mechanical polishing (CMP). Although copper has low resistivity and high reliability, copper still suffers from electro-migration (EM) and stress-migration (SM) reliability issues as geometries continue to shrink and current densities increase. Various approaches are thus explored to solve these problems.

FIG. 1 illustrates a conventional interconnect structure. Two copper lines 2 and 4 are formed adjacent to each other and are insulated from low-k dielectric layer 14 by diffusion barrier layers 6 and 8, respectively. Metal caps 10 and 12, which are typically formed of materials suffering less from electro-migration, are formed on copper lines 2 and 4, respectively. The formation of metal caps greatly improves the reliability of the integrated circuit by reducing the surface migration of the copper lines. It has been found that under stressed conditions, the mean time to failure (MTTF) of the illustrated interconnection structure may be ten times longer than that of an interconnect structure having no metal caps. Part of the reason for the improvement is the reduction of electro-migration. With the metal caps, stress-induced void formation is also significantly reduced.

The introduction of metal caps generates another problem, however. Metal caps are typically formed on copper lines, thus increasing the height of the conductive materials. In the illustrated example, the formation of metal caps 10 and 12 increases the height of the conductive materials from H to H'. The parasitic capacitance between copper lines 2 and 4 (as well as the conductive materials surrounding copper lines 2 and 4) form a parasitic capacitor, and the capacitance is proportional to the cross-sectional area of lines 2 and 4. Therefore, the formation of metal caps 10 and 12 causes the parasitic capacitance to be H'/H times the capacitance as if no metal caps are formed, wherein the increase may be as much as five to ten percent. As a result, the RC delay of the integrated circuit is increased.

An additional effect caused by the formation of metal caps 10 and 12 is the increase in leakage current. Since metal caps 10 and 12 are selectively formed on copper lines 2 and 4, but not on low-k dielectric layer 14, any selectivity loss will cause metal to be formed on low-k dielectric layer 14. The leakage current between metal caps 10 and 12 is thus increased.

In order to reduce parasitic capacitances and leakage currents between neighboring conductive features, a new method of forming interconnection structures is needed.

SUMMARY OF THE INVENTION

In accordance with one aspect of the present invention, an integrated circuit structure includes a semiconductor substrate; a dielectric layer over the semiconductor substrate; an opening in the dielectric layer; a conductive line in the opening; a metal alloy layer overlying the conductive line; a first metal silicide layer overlying the metal alloy layer; and a second metal silicide layer different from the first metal silicide layer on the first metal silicide layer. The metal alloy layer and the first and the second metal silicide layers are substantially vertically aligned to the conductive line.

In accordance with another aspect of the present invention, an integrated circuit structure includes a semiconductor substrate; a dielectric layer over the semiconductor substrate; a conductive line in the dielectric layer, wherein the conductive line comprises a metal; and an alloy layer on the conductive line, wherein the alloy layer comprises an alloy of a noble metal and the metal in the conductive line, and wherein the noble metal is more noble than the metal in the conductive line. The integrated circuit structure further includes an alloy silicide layer on the alloy layer, wherein the alloy silicide layer comprises a silicide of the alloy.

In accordance with yet another aspect of the present invention, an integrated circuit structure includes a semiconductor substrate; a low-k dielectric layer over the semiconductor substrate; a copper line in the first dielectric layer; and a transitional layer on the conductive line. The transitional layer includes an alloy layer on the copper line; an alloy silicide layer on the alloy layer, wherein the alloy silicide layer comprises a silicide of the alloy; and an alloy silicide nitride layer on the alloy silicide layer, wherein the alloy silicide nitride layer comprises a silicide nitride of the alloy. The alloy layer includes an alloy of a noble metal and copper. The alloy layer has a top surface of substantially no higher than a top surface of the low-k dielectric layer.

In accordance with yet another aspect of the present invention, a method for forming an integrated circuit structure includes providing a semiconductor substrate; forming a dielectric layer over the semiconductor substrate; forming an opening in the dielectric layer; forming a conductive line in the opening; forming a metal alloy layer overlying the conductive line; forming a first metal silicide layer overlying the metal alloy layer; and forming a second metal silicide layer different from the first metal silicide layer on the first metal silicide layer, wherein the metal alloy layer and the first and the second metal silicide layers are substantially vertically aligned to the conductive line.

In accordance with yet another aspect of the present invention, a method for forming an integrated circuit structure includes providing a semiconductor substrate; forming a low-k dielectric layer over the semiconductor substrate; forming a copper line in the low-k dielectric layer; forming a noble metal layer on the copper line, wherein the noble metal layer comprises a noble metal more noble than copper, and wherein the noble metal layer has a top surface substantially no higher than a top surface of the low-k dielectric layer; performing an annealing to form an alloy layer by alloying the noble metal layer and a top layer of the copper line; siliciding a top portion of the alloy layer to form an alloy silicide layer; and nitridating a top portion of the alloy silicide layer to form an alloy silicide nitride layer on the alloy silicide layer.

The advantageous features of the present invention include reduced parasitic capacitance, hence reduced RC delay, and improved adhesion between copper lines and overlying dielectric layers.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Interconnect structures comprising transitional interfaces between metal lines and overlying dielectric layers and methods of forming the same are provided. The intermediate stages of manufacturing an embodiment of the present invention are illustrated in FIGS. 2 through 8. Throughout the various views and illustrative embodiments of the present invention, like reference numbers are used to designate like elements.

Figure 1:
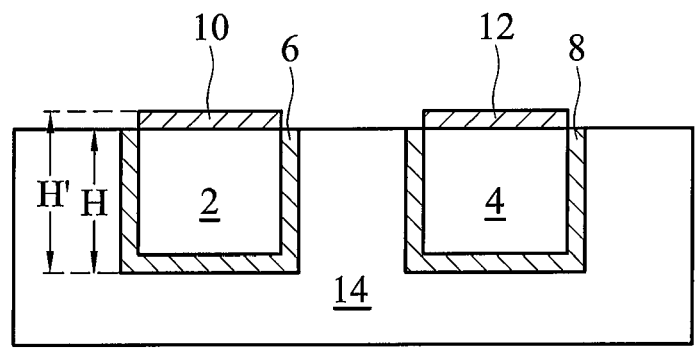
FIG. 1 illustrates a conventional interconnect structure with metal caps formed on copper lines.
Figure 2:
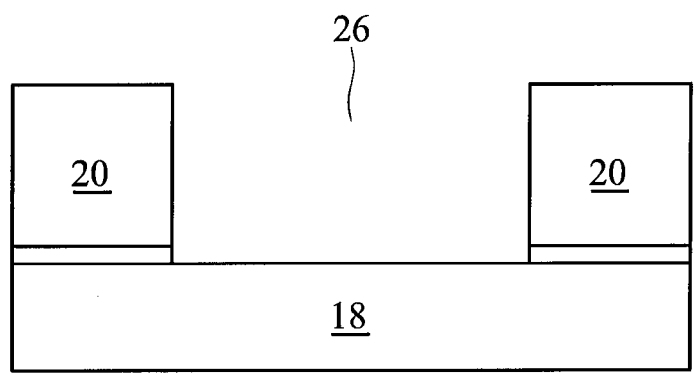
FIGS. 2 through 8 are cross-sectional views of intermediate stages in the manufacturing of an embodiment of the present invention, wherein a transitional layer is formed between a copper line and an overlying dielectric layer.

FIG. 2 illustrates the formation of opening 26 in dielectric layer 20, which is formed over a schematically illustrated base layer 18. Base layer 18 may include a semiconductor substrate and overlying layers such as contact etch stop layer, inter-layer dielectric, and inter-metal dielectrics (not shown). The semiconductor substrate may be a single crystalline or a compound semiconductor substrate. Active devices (not shown), such as transistors, may be formed on the semiconductor substrate. Opening 26 may be a trench for forming a metal line. In an exemplary embodiment, dielectric layer 20 has a low dielectric constant (k value), preferably lower than about 3.0, hence is referred to as low-k dielectric layer 20 throughout the description. More preferably, low-k dielectric layer 20 has a k value of less than about 2.5. Low-k dielectric layer 20 may include commonly used materials such as carbon-containing dielectric materials, and may further contain nitrogen, hydrogen, oxygen, and combinations thereof. A porous structure is preferred for lowering the k value. The preferred thickness of low-k dielectric layer 20 is between about 1000 Å and about 3500 Å. One skilled in the art will realize, however, that the dimensions recited throughout the description are related to the technology used for forming the integrated circuits, and will reduce with the change of the formation technology.

Figure 3:
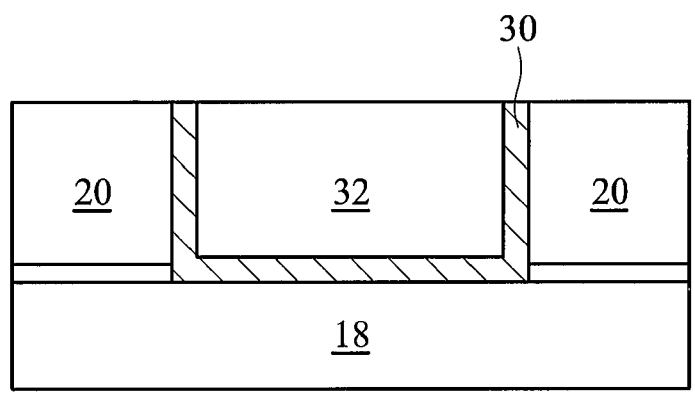

FIG. 3 illustrates the formation of diffusion barrier layer 30 for lining opening 26, and conductive line 32 in opening 26. Diffusion barrier layer 30 preferably includes titanium, titanium nitride, tantalum, tantalum nitride, or other alternatives, and may be formed using physical vapor deposition (PVD) or one of the chemical vapor deposition (CVD) methods. The thickness of diffusion barrier layer 30 may be between about 20 Å and about 200 Å.

Conductive line 32 preferably comprises copper or copper alloys. Throughout the description, conductive line 32 is alternatively referred to as copper line 32, although it may include other conductive materials, such as silver, gold, tungsten, aluminum, and combinations thereof. As is known in the art, the steps for forming barrier layer 30 and copper line 32 may include blanket forming diffusion barrier layer 30; depositing a thin seed layer of copper or copper alloy on diffusion barrier layer 30; and filling remaining opening 26 with a conductive material, such as copper or copper alloys, preferably by plating. A chemical mechanical polish (CMP) is then performed to remove excess conductive material on low-k dielectric layer 20, leaving diffusion barrier layer 30 and copper line 32 only in opening 26.

A pretreatment is optionally performed to treat the surface of copper line 32. In the preferred embodiment, the pretreatment includes a nitrogen-based gas treatment in a production tool, such as one used for plasma enhanced chemical vapor deposition (PECVD). The hydrogen-based gases preferably include $N_2$, $NH_3$, and the like. In alternative embodiments, the pretreatment is performed in a hydrogen-based gas environment, which contains hydrogen-containing gases, such as $H_2$, $NH_3$, and the like. The pretreatment has the function of reducing native copper oxide to copper and removing chemical contamination from copper line 32.

Figure 4:
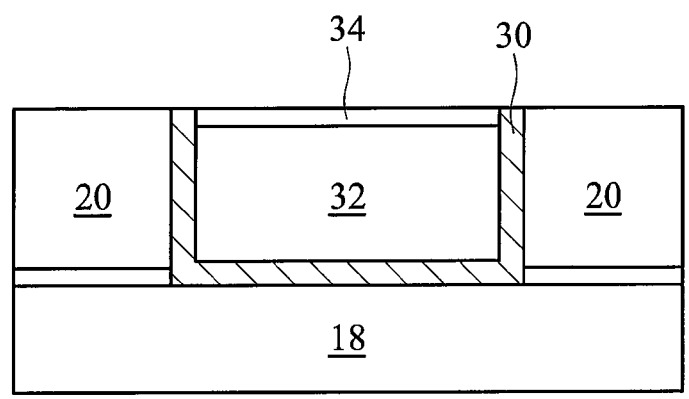

FIG. 4 illustrates the formation of noble metal layer 34. In the preferred embodiment, noble metal layer 34 includes a metal having a higher Redox Potential than that of copper, and thus the metal is more noble than copper. Further, the noble metal is capable of forming alloys with copper and silicon. Exemplary noble metals include silver (Ag), gold (Au), palladium (Pd), platinum (Pt), ruthenium (Ru), rhodium (Rh), and combinations thereof. In the preferred embodiment, noble metal layer 34 is formed using galvanic chemical displacement reaction, wherein the structure shown in FIG. 3 is submerged in a solution for the reaction. The solution contains ions of the noble metals, wherein the ion concentration may be between about 0.001 milli-mole/liter and about 5 milli-mole/liter. Exemplary reaction conditions include a solution temperature of between about 25° C. and about 90° C., and a solution pH value of between about 1 and about 10.

During the displacement reaction, the noble metal in the solution replaces a top layer of copper line 32, and thus noble metal layer 34 is deposited. The top surface of the resulting noble metal layer 34 substantially levels with, and may even be slightly lower than, the top surface of low-k dielectric layer 20. The thickness of noble metal layer 34 is preferably between about 10 Å and about 100 Å. In alternative embodiments, copper line 32 is recessed, for example, by etching, and noble metal layer 34 is selectively deposited into the recess.

Figure 5:
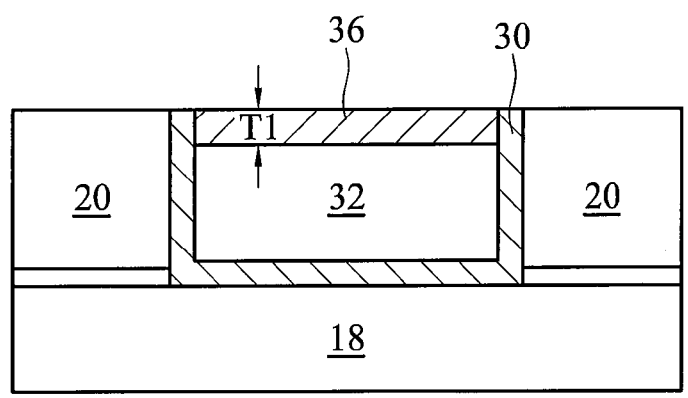

Referring to FIG. 5, an annealing is performed. Noble metal layer 34 thus forms alloy layer 36 with the underlying copper line 32. In the preferred embodiment, the annealing temperature is between about 100° C. and about 600° C., and more preferably between about 200° C. and about 500° C. The annealing duration is preferably between about 1 second and about 5 minutes. Thickness T1 of alloy layer 36 may be between about 10 Å and about 100 Å. Preferably, noble metal layer 34 is fully alloyed, although there is a chance a thin noble metal layer 34 remains on top of alloy layer 36 if a low annealing temperature and/or a short annealing duration is adopted.

Figure 6:
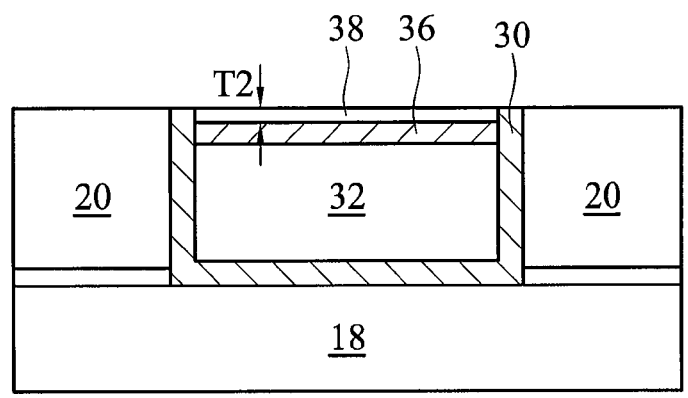

FIG. 6 illustrates the formation of alloy silicide layer 38. In an embodiment, the structure shown in FIG. 5 is thermally soaked in a silicon-containing gas, such as silane ($SiH_4$), wherein the thermal soaking is performed in an environment (ambient) at an elevated temperature, for example, higher than about 200° C., and more preferably between about 200° C. and about 600° C. Throughout the description, when the term "thermal soaking" is referred to, it indicates that plasma is not turned on, unless specifically noted. In an exemplary embodiment, the pressure of the soaking gas is between about 1 mtorr and about 10 mtorr. In the thermal environment, the silicon-containing soaking gas reacts with alloy layer 36 to form alloy silicide layer 38 on alloy layer 36. One skilled in the art will perceive that thickness T2 of alloy silicide layer 38 is related to the temperature and soaking duration. In an exemplary embodiment, the soaking duration is between about 1 second and about 30 second. Accordingly, thickness T2 is between about 5 Å and about 70 Å, and the remaining thickness of alloy layer 36 is between about 5 Å and about 30 Å.

In the preferred embodiment, the temperature and soaking duration is adjusted so that alloy layer 36 is only partially silicided. It is realized that due to different patterns densities and structures on a wafer, alloy layer 36 in some regions of the wafer may be silicided more than in other regions. Accordingly, process is preferably controlled, so that alloy layer 36 in all regions of the wafer are partially silicided. However, it is to be realized that there are still likely some fully silicided portions of alloy layer 36. Advantageously, with a partial silicidation, the remaining alloy layer 36 prevents silicon from siliciding underlying copper line 32, which may generate undesirably unstable copper silicide.

Figure 7:
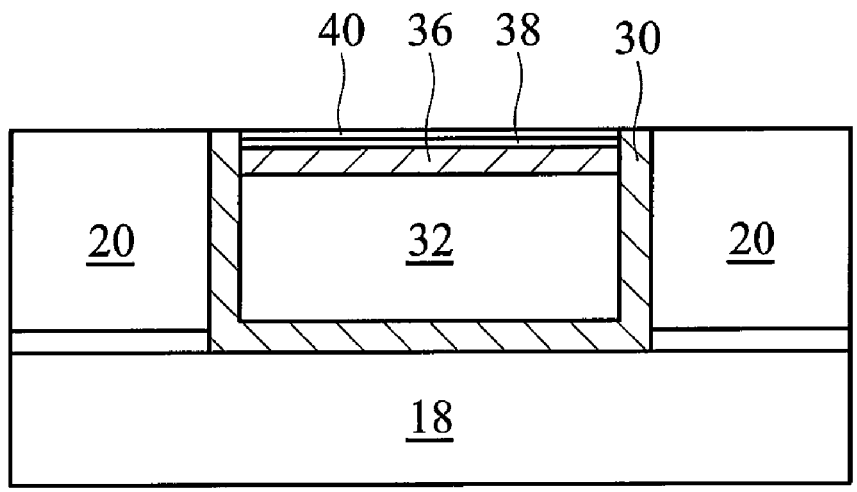

Referring to FIG. 7, alloy silicide layer 38 is nitridated to form alloy silicide nitride layer 40. In the preferred embodiment, the nitridation includes a plasma treatment of alloy silicide layer 38 in a nitrogen-containing environment. In an exemplary embodiment, process gases include ammonia ($NH_3$) with a pressure of between about 1 mtorr and about 10 mtorr. In other embodiments, the process gases may also include other commonly used treatment gases and carrier gases such as $H_2$ and $N_2$, and the like. Preferably, alloy silicide nitride layer 40 has a thickness of only several angstroms, for example, between about 3 Å and about 10 Å. Accordingly, the treatment time is preferably short, with, for example, only several seconds. As a result of the preceding process steps, a transitional layer, with includes one or more of alloy layer 36, alloy silicide layer 38 and alloy silicide nitride layer 40, is formed between copper line 32 and a subsequently formed etch stop layer (ESL) or inter-metal dielectric.

In the embodiment wherein noble metal layer 34 is not fully alloyed, and thus a thin noble metal layer 34 is left on alloy layer 36 after the annealing, the resulting layer 40 may comprise a noble metal silicide nitride layer instead of alloy silicide nitride layer.

Figure 8:
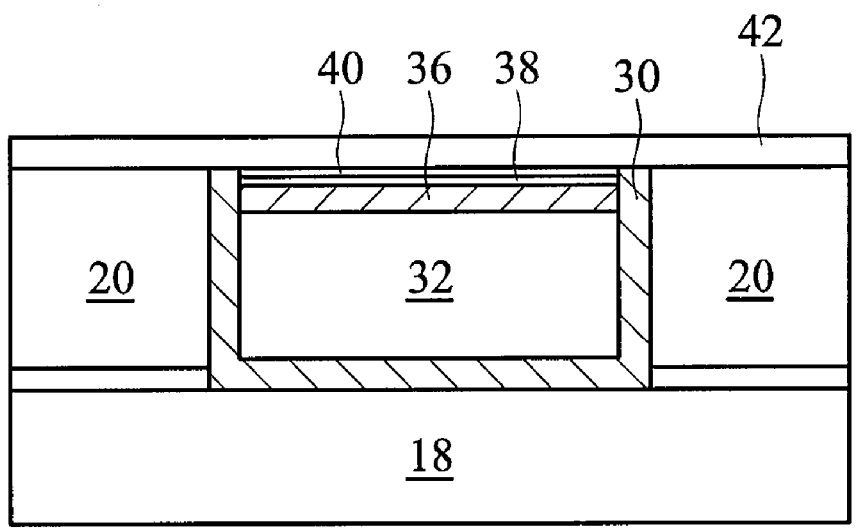

Alloy silicide nitride layer 40 may be used as an etch stop layer (ESL). However, an optional ESL 42 may be formed if desirable, as is shown in FIG. 8. ESL 42 preferably has a dielectric constant of less than about 4.0, and may comprise materials such as SiC, SiCN, SiCO, SiN, carbon-based materials, and combinations thereof. The preferred thickness of ESL 42 is between about 200 Å and about 1000 Å.

Figure 9:
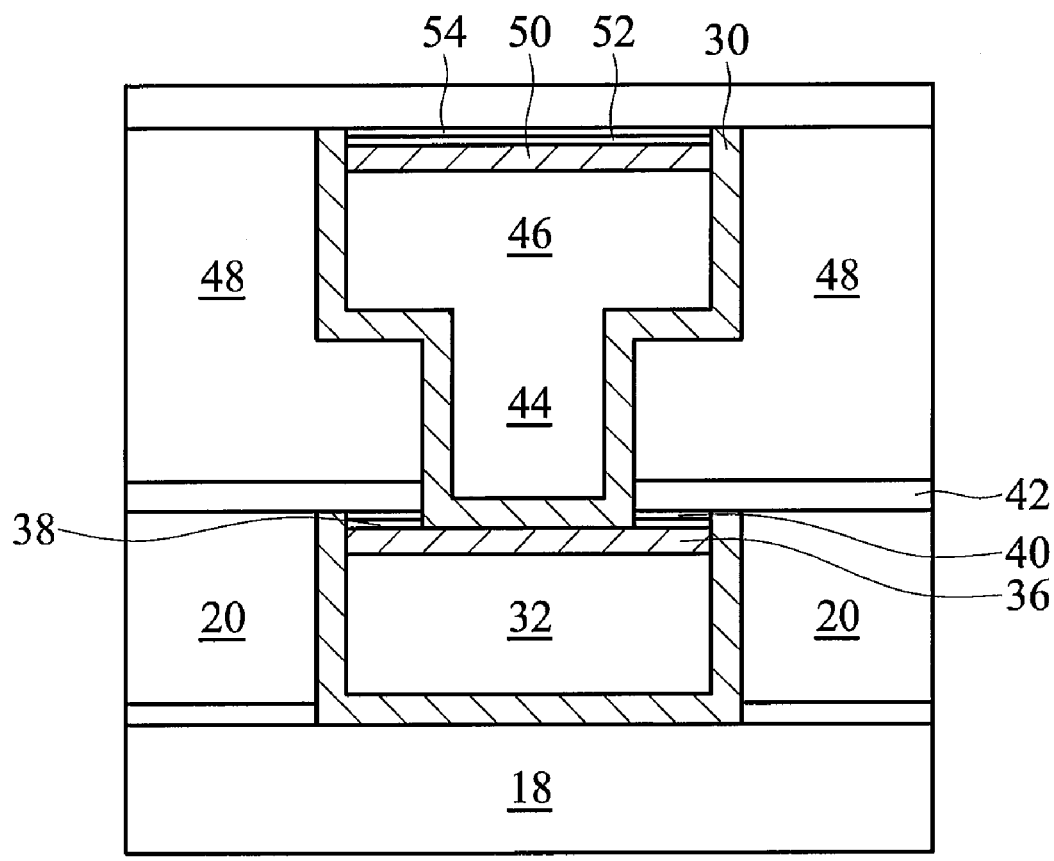
FIG. 9 illustrates an embodiment of the present invention including a dual damascene structure.

In the preceding paragraphs, single damascene processes are discussed. One skilled in the art will realize that the teaching is readily available for dual damascene processes. FIG. 9 illustrates a dual damascene embodiment, which includes via 44 and the overlying copper line 46 in low-k dielectric layer 48. Using essentially the same process steps and materials as discussed in the preceding paragraphs, alloy layer 50, alloy silicide layer 52 and alloy silicide nitride layer 54 may be formed.

In the above-discussed embodiments, if conductive line 32 is formed of other metals than copper, the concept of the present invention may still be applied by selecting metals that are more noble than the metals in conductive line 32.

An advantageous feature of the embodiments of the present invention is that the galvanic chemical displacement reaction has high selectivity, and thus the likelihood of metal being formed on low-k dielectric layer 20 is substantially eliminated. The displacement reaction also results in the transitional layer to be recessed, and thus the adverse increase in parasitic capacitance caused by metal cap layers is at least reduced, and possibly eliminated. In addition, the top alloy silicide layer or alloy silicide nitride layer has a good adhesion to the overlying ESL or inter-metal dielectric.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an integrated circuit structure, the method comprising:
   providing a semiconductor substrate;
   forming a dielectric layer over the semiconductor substrate;
   forming an opening in the dielectric layer;
   forming a conductive line in the opening;
   forming a metal alloy layer overlying the conductive line, wherein the step of forming the metal alloy layer comprises:
      selectively forming a metal layer on the conductive line, wherein the metal layer replaces a top layer of the conductive line; and
      performing an annealing to alloy the metal layer and the conductive line;
   after the annealing, forming a first metal silicide layer overlying the metal alloy layer; and forming a second metal silicide layer different from the first metal silicide layer on the first metal silicide layer, wherein the metal alloy layer and the first and the second metal silicide layers are substantially vertically aligned to the conductive line.

2. The method of claim 1, wherein the annealing is performed at a temperature of between about 100° C. and about 600° C.

3. The method of claim 1, wherein the step of forming the metal layer comprises:
performing a galvanic chemical displacement reaction on the conductive line using a solution comprising a noble metal more noble than a metal in the conductive line.

4. The method of claim 3, wherein the conductive line comprises copper, and wherein the noble metal is selected from the group consisting essentially of silver (Ag), gold (Au), palladium (Pd), platinum (Pt), ruthenium (Ru), rhodium (Rh), and combinations thereof.

5. The method of claim 1, wherein the step of forming the first metal silicide layer comprises thermal silane soaking the alloy layer.

6. The method of claim 5, wherein the thermal silane soaking is performed at a temperature of between about 200° C. and about 600° C.

7. The method of claim 1, wherein the step of forming the second metal silicide layer comprises nitridating the first metal silicide layer.

8. The method of claim 7, wherein the step of nitridating comprises plasma treating the first metal silicide layer in a nitrogen-containing environment.

9. The method of claim 1, wherein after the step of forming the alloy layer, a top surface of the alloy layer is substantially level with or lower than a top surface of the dielectric layer.

10. A method for forming an integrated circuit structure, the method comprising:
providing a semiconductor substrate;
forming a low-k dielectric layer over the semiconductor substrate;
forming a copper line in the low-k dielectric layer;
forming a noble metal layer on the copper line, wherein the noble metal layer comprises a noble metal more noble than copper, and wherein the noble metal layer has a top surface substantially no higher than a top surface of the low-k dielectric layer;
performing an annealing to form an alloy layer by alloying the noble metal layer and a top layer of the copper line;
siliciding a top portion of the alloy layer to form an alloy silicide layer; and
nitridating a top portion of the alloy silicide layer to form an alloy silicide nitride layer on the alloy silicide layer.

11. The method of claim 10, wherein the step of forming the noble metal layer comprises a galvanic chemical displacement reaction.

12. The method of claim 10, wherein the step of siliciding comprises thermal silane soaking.

13. The method of claim 10, wherein the step of nitridating comprises plasma treating the alloy silicide layer in an ammonia-containing environment.

14. The method of claim 13, wherein the step of nitridating is performed for less than about 10 seconds.

15. The method of claim 10, wherein the noble metal is selected from the group consisting essentially of silver (Ag), gold (Au), palladium (Pd), platinum (Pt), ruthenium (Ru), rhodium (Rh), and combinations thereof.

16. The method of claim 15, wherein the noble metal is selected from the group consisting essentially of silver (Ag), gold (Au), platinum (Pt), ruthenium (Ru), rhodium (Rh), and combinations thereof.

17. A method for forming an integrated circuit structure, the method comprising:
providing a semiconductor substrate;
forming a dielectric layer over the semiconductor substrate;
forming an opening in the dielectric layer;
forming a conductive line in the opening;
forming a metal alloy layer overlying the conductive line, wherein the metal alloy layer comprises a noble metal selected from the group consisting essentially of silver (Ag), gold (Au), platinum (Pt), ruthenium (Ru), rhodium (Rh), and combinations thereof;
forming a first metal silicide layer overlying the metal alloy layer; and
forming a second metal silicide layer different from the first metal silicide layer on the first metal silicide layer, wherein the metal alloy layer and the first and the second metal silicide layers are substantially vertically aligned to the conductive line.

18. The method of claim 17, wherein the step of forming the metal alloy layer comprises:
selectively forming a metal layer on the conductive line, wherein the metal layer replaces a top layer of the conductive line; and
before the step of forming the first metal silicide layer, performing an annealing to alloy the metal layer and the conductive line to form the metal alloy layer.

* * * * *